United States Patent
Kirsch

(10) Patent No.: US 9,813,039 B2
(45) Date of Patent: Nov. 7, 2017

(54) MULTIBAND DUCKER

(71) Applicant: HARMAN INTERNATIONAL INDUSTRIES, INC., Stamford, CT (US)

(72) Inventor: James M. Kirsch, Salt Lake City, UT (US)

(73) Assignee: HARMAN INTERNATIONAL INDUSTRIES, INCORPORATED, Stamford, CT (US)

( * ) Notice: Subject to any disclaimer, the term of this patent is extended or adjusted under 35 U.S.C. 154(b) by 158 days.

(21) Appl. No.: 14/486,451

(22) Filed: Sep. 15, 2014

(65) Prior Publication Data
US 2016/0079947 A1    Mar. 17, 2016

(51) Int. Cl.
  *H03G 3/34*  (2006.01)
  *H04R 1/10*  (2006.01)
  *H03G 3/20*  (2006.01)
  *H03G 3/32*  (2006.01)
  *G10L 21/0208*  (2013.01)
  (Continued)

(52) U.S. Cl.
  CPC ......... *H03G 3/342* (2013.01); *G10L 21/0208* (2013.01); *H03G 3/20* (2013.01); *H03G 3/32* (2013.01); *H04R 1/1041* (2013.01); *H03G 5/165* (2013.01); *H04R 3/00* (2013.01); *H04R 2420/01* (2013.01); *H04S 2420/07* (2013.01)

(58) Field of Classification Search
  CPC ............ H03G 3/342; H03G 3/20; H03G 3/32; H03G 5/165; G10L 21/0208
  See application file for complete search history.

(56) References Cited

U.S. PATENT DOCUMENTS 5,228,093 A * 7/1993 Agnello ................. H04H 60/04
                                                    381/119
5,633,938 A * 5/1997 Porter, III ................ H03G 5/22
                                                    381/1
(Continued)

FOREIGN PATENT DOCUMENTS

WO    2014022359 A2    2/2014

OTHER PUBLICATIONS

European search report for Application No. 15 184 641.7, dated May 2, 2016.

*Primary Examiner* — Ping Lee
(74) *Attorney, Agent, or Firm* — Artegis Law Group, LLP

(57) ABSTRACT

A multiband ducker is configured to duck a specific range of frequencies within a music signal in proportion to a corresponding range of frequencies within a speech signal, and then combine the ducked music signal with the speech signal for output to a user. In doing so, the multiband ducker separates the music signal into different frequency ranges, which may include low, middle, and high-range frequencies. The multiband ducker then reduces the amplitude of the specific range of frequencies found in the speech signal, typically the mid-range frequencies. When the ducked music signal and the speech signal are combined, the resultant signal includes important frequencies of the original music signal, including low-range and high-range, thereby allowing perception of the music signal to continue in relatively uninterrupted fashion. Additionally, the combined signal also includes the speech signal, allowing for the perception of intelligible speech concordant with the perception of music.

23 Claims, 7 Drawing Sheets

(51) Int. Cl.
*H04R 3/00* (2006.01)
*H03G 5/16* (2006.01)

(56) References Cited

U.S. PATENT DOCUMENTS

2009/0245539 A1\* 10/2009 Vaudrey .................. H04R 5/04
381/109
2011/0317852 A1\* 12/2011 Kawano ................ H04H 60/04
381/98

\* cited by examiner

MULTIBAND DUCKER

BACKGROUND

Field of the Embodiments of the Invention

Embodiments of the present invention relate generally to audio devices and, more specifically, to a multiband ducker.

Description of the Related Art

As known in the art, a "ducker" is an auxiliary device that is coupled to a music source or other audio source and configured to temporarily interrupt that source in order to broadcast a speech signal or another type of intermittent audio signal. Conventional duckers are implemented in many well-known contexts. For example, a supermarket oftentimes plays background music, and could rely upon a ducker to interrupt that music when making a public-address announcement. The ducker temporarily mutes the background music or stops that music from playing, thereby allowing the announcer to speak without disruption. Similarly, restaurants often employ duckers to temporarily silence ambient music in order to announce that a particular table is ready for a waiting party. Duckers may be sufficient in contexts where background music is interrupted for the sake of announcements, such as those mentioned above. However, in other contexts where listeners are actively engaged with the music being played, conventional duckers are insufficient.

For example, gyms and other athletic facilities typically play music that many patrons actively listen to for the sake of channeling mental focus into the acts of lifting weights, running, and performing other high-energy activities. When a conventional ducker disrupts this music, i.e., in order to make an announcement, those patrons who are actively listening to the music may suddenly be disturbed and lose focus. This problem may also arise with personal listening devices that double as communication devices. For example, certain types of headphones play music and also act as communication devices. Such headphones could receive a communication for the user, and a conventional ducker could then temporarily silence the music in response. However, in like fashion as described above, the listener could be disturbed by the sudden loss of music.

As the foregoing illustrates, conventional duckers cannot be applied to certain types of situations without negatively impacting the overall user experience. Accordingly, what would be useful is an improved ducker design that can be used in a wider variety of contexts.

SUMMARY

One or more embodiments set forth include a method for generating an audio signal, including receiving a first signal associated with a first frequency range, receiving a second signal associated with a second frequency range, adjusting an amplitude associated with the second signal and corresponding to the second frequency range in inverse proportion to an amplitude associated with the first signal and corresponding to the first frequency range to generate an adjusted second signal, combining the first signal with the adjusted second signal to generate a combined signal, and causing an output device to output the combined signal.

At least one advantage of the approach described herein is that users may listen to music in a continuous and uninterrupted manner and still maintain a certain degree of awareness of the external auditory environment.

BRIEF DESCRIPTION OF THE SEVERAL VIEWS OF THE DRAWINGS

So that the manner in which the recited features of the one or more embodiments set forth above can be understood in detail, a more particular description of the one or more embodiments, briefly summarized above, may be had by reference to certain specific embodiments, some of which are illustrated in the appended drawings. It is to be noted, however, that the appended drawings illustrate only typical embodiments and are therefore not to be considered limiting of its scope in any manner, for the scope of the invention subsumes other embodiments as well.

DETAILED DESCRIPTION

In the following description, numerous specific details are set forth to provide a more thorough understanding of certain specific embodiments. However, it will be apparent to one of skill in the art that other embodiments may be practiced without one or more of these specific details or with additional specific details.

System Overview

Figure 1A:
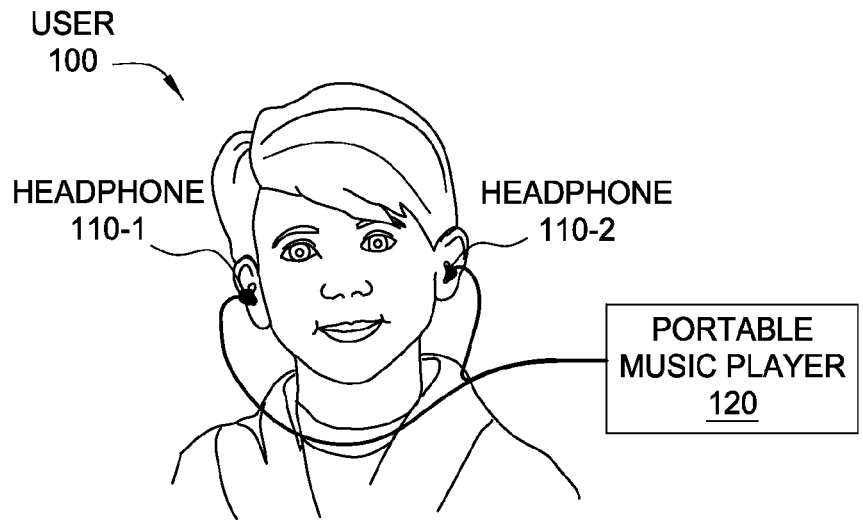
FIG. 1A illustrates a portable music player coupled to a set of headphones, according to various embodiments.

FIG. 1A illustrates a portable music player coupled to a set of headphones that includes one or more instances of a multiband ducker, according to various embodiments. As shown, a user 100 wears a right headphone 110-1 and a left headphone 110-2. Although shown as in-ear headphones (also referred to as "ear buds"), headphones 110 may also be implemented as over-the-ear headphones that include speaker cups, for example, and without limitation. Each headphone 110 is coupled to a portable music player 120. Portable music player 120 may be any technically feasible audio device that is configured to generate audio signals. For example, and without limitation, portable music player 120 could be an mp3 player, a compact disc (CD) player, an audio cassette player, radio, and so forth. The audio signals generated by portable music player could be any type of audio signal, although typically portable music player 120 generates music signals. Portable music player 120 is configured to output generated audio signals to headphones 110, which, in turn, output acoustic signals to user 100. In this fashion, user 100 may listen to music by wearing headphones 110 and operating portable music player 120.

Each headphone 110 is configured to include a microphone capable of transducing audio signals from the external environment where user 100 resides, including speech from persons residing proximate to user 100, as well as other acoustic signals. Each headphone 110 also includes a "multiband ducker" that is configured to process the audio signals transduced from the external environment and to combine those signals with the audio signal output by portable music player 120. As described in greater detail below in conjunction with FIG. 1B, the multiband ducker within each headphone 110 is configured to modulate the audio signal output by the portable music player, based on the transduced signal received from the microphone, to reduce potential interference between those audio signals. Those two signals may then be safely combined without significant interference, and the combined signal output to the user. With this approach, user 100 may listen to music while also remaining aware of the external auditory environment.

Figure 1B:
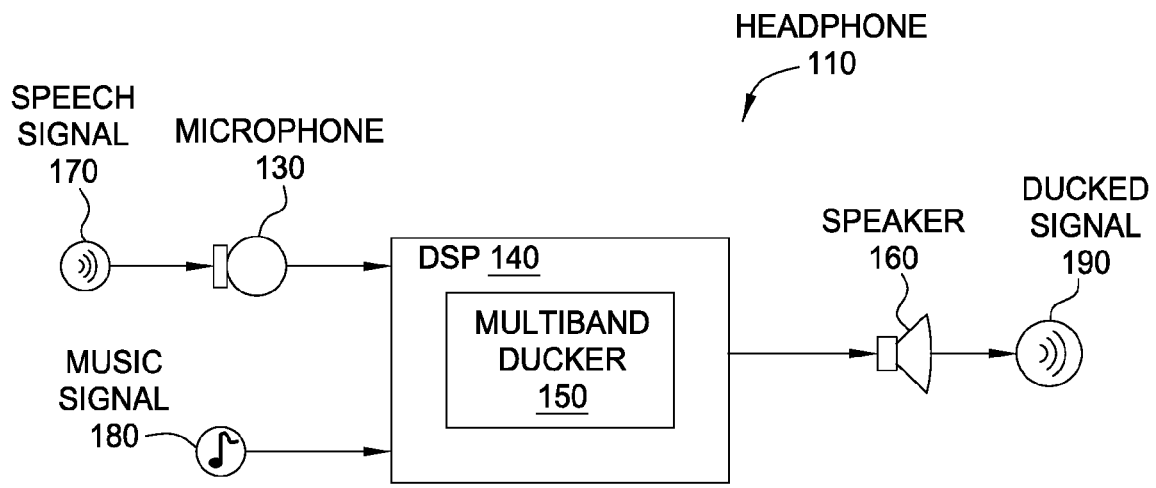
FIG. 1B illustrates headphone 110 of FIG. 1A in greater detail, according to various embodiments.

FIG. 1B illustrates headphone 110 of FIG. 1A in greater detail, according to various embodiments. As shown, headphone 110 includes a microphone 130, a digital signal processor (DSP) 140 that includes multiband ducker 150, and a speaker 160. Microphone 130 is configured to transduce a speech signal 170 and to transmit that speech signal to DSP 140. DSP 140 also receives a music signal 180 that is output by portable music player 120. Multiband ducker 150 within DSP 140 is configured to perform a multiband ducking operation in order to combine speech signal 170 with music signal 180 to generate ducked signal 190. Speaker 160 may then output ducked signal 190 to user 100. Speech signal 170 may be referred to herein as a "priority" signal while music signal 180 may be referred to herein as a "primary" signal. Persons skilled in the art will recognize that any type of priority signal and any type of primary signal, beyond speech and music, respectively, falls within the scope of the present invention.

Figure 2A:
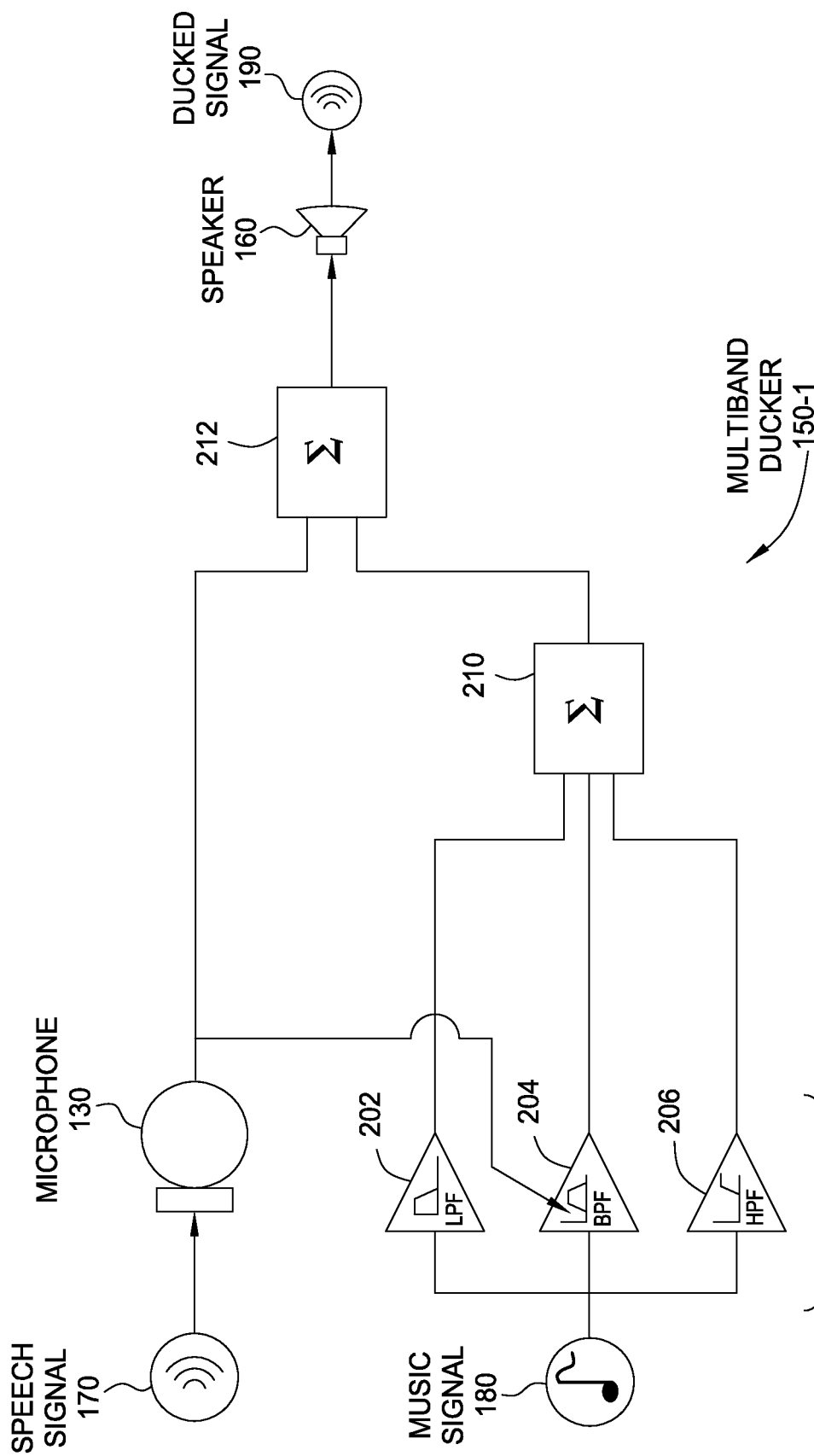
FIGS. 2A-2C illustrate different implementations of the multiband ducker of FIG. 1B, according to various embodiments.
Figure 2B:
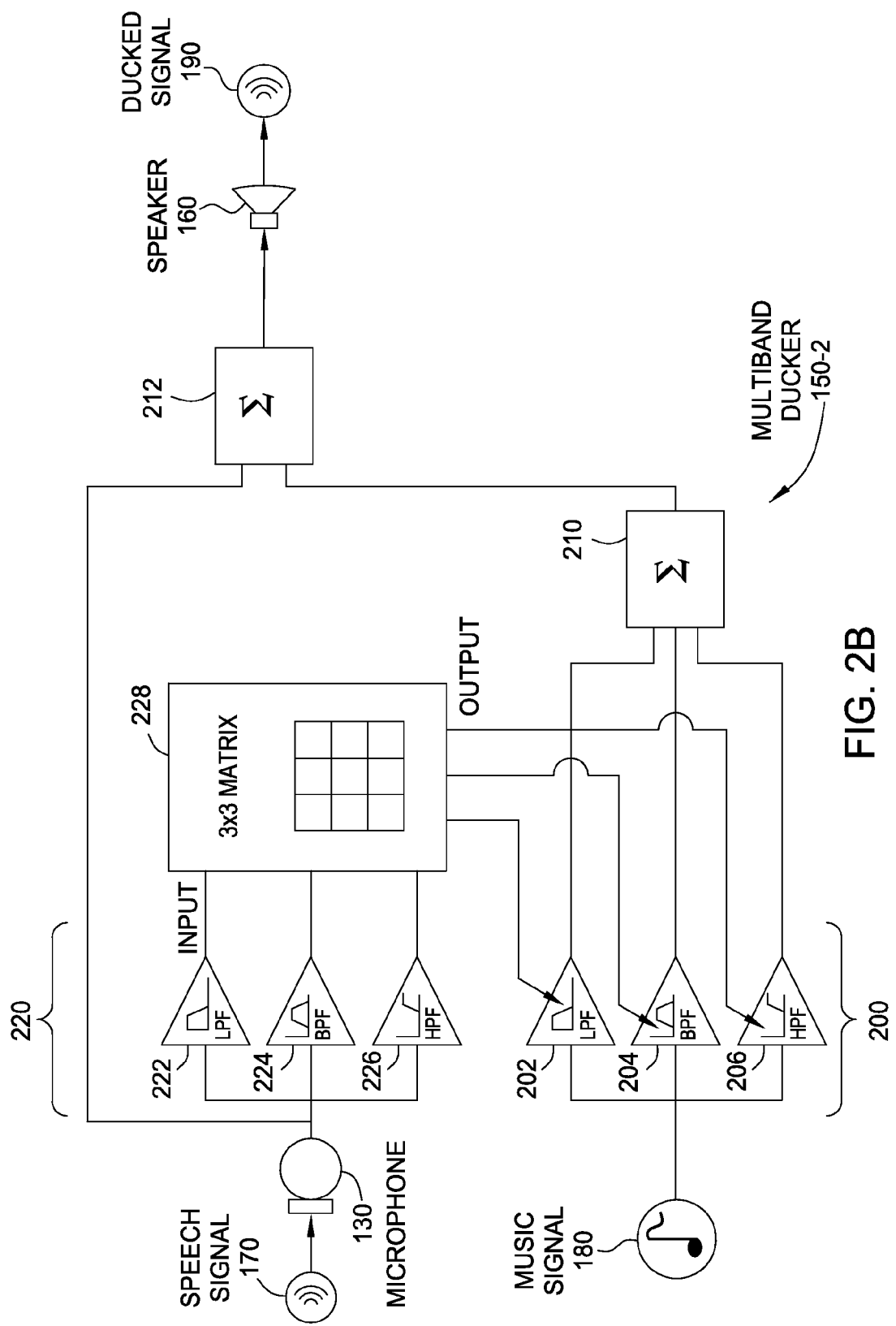
Figure 2C:
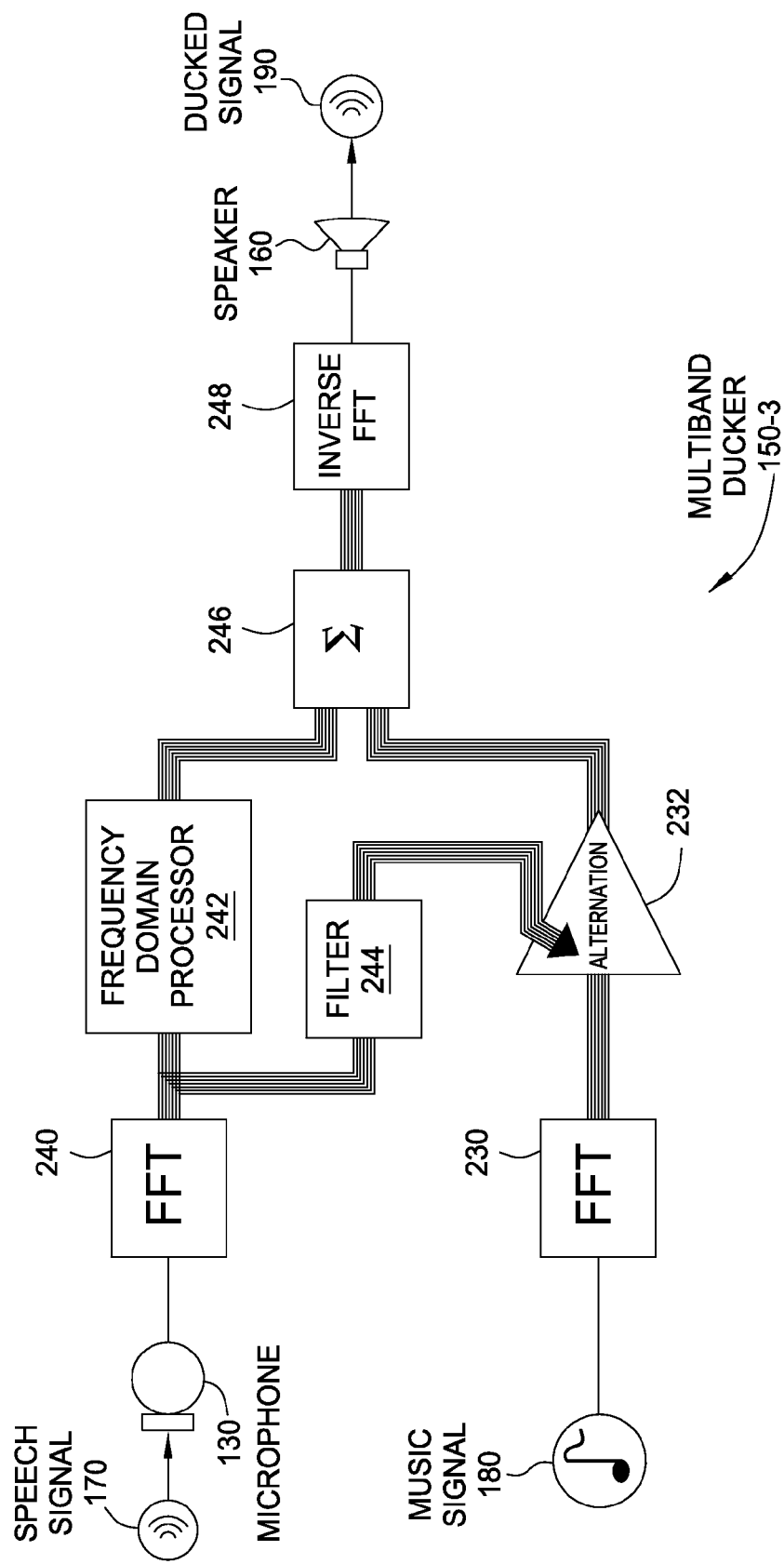

Ducked signal 190 reflects both speech signal 170 and music signal 180, however, multiband ducker 150 has reduced the amplitude of frequencies within music signal 180 that may interfere with corresponding frequencies within speech signal 170, thereby avoiding interference between these two signals. More specifically, multiband ducker 150 may reduce mid-range frequencies in music signal 180 to account for mid-range frequencies that are typically found in speech signals, such as speech signal 170. FIGS. 2A-2C, described in greater detail below, illustrate various implementations of multiband ducker 150 that may achieve the functionality described above, according to various embodiments.

Exemplary Implementations of a Multiband Ducker

FIGS. 2A illustrates a multiband ducker 150-1 configured to adjust mid-range frequencies of music signal 180 based on speech signal 170, according to various embodiments. Multiband ducker 150-1 represents one exemplary implementation of multiband ducker 150 of FIG. 1B. As shown, multiband ducker 150-1 includes a crossover filter 200 that, in turn, includes a low-pass filter (LPF) 202, a band-pass filter (BPF) 204, and a high-pass filter (HPF) 206. Multiband ducker 150-1 also includes summation blocks 210 and 212.

Crossover filter 200 is configured to separate music signal 180 into low, mid, and high-range signals via LPF 202, BPF 204, and HPF 206, respectively. In particular, LPF 202 is configured to output a low range signal, BPF 204 is configured to output a mid range signal, and HPF 206 is configured to output a high range signal derived from music signal 180. The low range signal may include frequencies below 400 Hz, the mid range signal may include frequencies between 400 Hz and 4 kHz, and the high range signal may include frequencies above 4 kHz. Persons skilled in the art will recognize that these specific values are variable and not meant to limit the scope of the present invention. Persons skilled in the art will also recognize that any technically feasible type of filter may perform the functionality of crossover filter 220. As a general matter, the frequencies associated with the mid range signal output by BPF 204 may be similar to the frequencies associated with speech signal 170. As is known in the art, speech signals typically fall within the mid range of frequencies, and so the mid range frequencies of music signal 180 could, potentially, interfere with the mid range frequencies present in speech signal 170.

To avoid the potential interference mentioned above, multiband ducker 150-1 shown in FIG. 2A is configured such that the output of microphone 130 inversely drives the gain of BPF 204, thereby reducing the amplitude of the mid range signal (and corresponding mid range frequencies) derived from music signal 180 in proportion to the amplitude of speech signal 170. Following this adjustment, summation block 210 combines the low range signal output by LPF 202, the adjusted mid range signal output by BPF 204, and the high range signal output by HPF 206 to reconstruct music signal 180, albeit with reduced frequencies in the middle range. Then, summation block 212 incorporates speech signal 170 into the combined signal output by summation block 210 to generate ducked signal 190, which is output by speaker 160.

Ducked signal 190 includes both speech signal 170 and an adjusted version of music signal 180 generated in the fashion described above to account for the mid range frequencies present in speech signal 170, thereby avoiding interference with that signal and allowing user 100 to perceive speech signal 170. Additionally, since ducked signal 190 includes high range and low range frequencies of music signal 180, user 100 may also continue to perceive music signal 180 in a relatively undisturbed manner. Specifically, rhythmic attributes of music signal 180 may still be present within ducked signal 190, including those generated by, for example, and without limitation, a bass drum, bass guitar, or a kick drum, thereby allowing user 100 to maintain uninterrupted focus on the rhythm of music signal 180. Additionally, other high range attributes of music signal 180 may still be present in ducked signal 190, including those generated by a snare drum or a high-hat, for example and without limitation, thereby allowing user 100 to maintain uninterrupted focus on those attributes as well.

With the functionality that the aforementioned design affords, user 100 may enjoy the relatively undisturbed perception of music generated by portable music player 120 while retaining a certain degree of awareness relative to the external environment. In practice, user 100 may continue listening to music while conversing with other people, because potential interference between the speech of others and the music to which user 100 listens can be actively reduced. FIG. 2B, described in greater detail below, illustrates another possible implementation of multiband ducker 150.

FIG. 2B illustrates a multiband ducker 150-2 configured to adjust low range, mid range, and high range frequencies associated with music signal 180 based on corresponding ranges of frequencies within speech signal 170, according to various embodiments. As shown, multiband ducker 150-2 includes some of the same elements as multiband ducker 150-1 of FIG. 2A. In addition, multiband ducker 150-2 also includes a crossover filter 220 that includes LPF 222, BPF 224, and HPF 226. Multiband ducker 150-2 also includes a 3×3 matrix 228.

Crossover filter 220 is configured to separate speech signal 170 into low, mid, and high range signals via LPF 222, BPF 224, and HPF 226, respectively. LPF 222 is configured to output low range frequencies, BPF 224 is configured to output mid range frequencies, and HPF 226 is configured to output high range frequencies of speech signal 170. Crossover filter 220 outputs these different signals to 3×3 matrix 228. 3×3 matrix 228 includes different mappings between the outputs of LPF 222, BPF 224, and HPF 226 and each one of LPF 202, BPF 204, and HPF 206. In other embodiments, the matrix 228 may have many have any technically feasible dimensions. As a general matter, and without limitation, the matrix 228 may have a number of inputs (rows) equal to the number of filters within crossover filter 220, and a number of outputs (columns) equal to the number of filters within crossover filter 200.

More specifically, each of the three columns of 3×3 matrix 228 includes a different set of gain values for modifying the three outputs of crossover filter 220 and corresponding inputs to crossover filter 200. For a given column, each of the three row values included therein reflects a different gain value for one of LPF 222, BPF 224, and HPF 226. 3×3 matrix 228 is configured to apply the gain values within a given column to the respective outputs of LPF 222, BPF 224, and HPF 226 to generate a combined gain value for input to one of LPF 202, BPF 204, and HPF 206. For example, the first column of 3×3 matrix 228 could include gain values that may be applied to the outputs of LPF 222, BPF 224, and HPF 226 to generate a combined gain value for LPF 202. Likewise, the second column of 3×3 matrix 228 could include gain values that may be applied to the outputs of LPF 222, BPF 224, and HPF 226 to generate a combined gain value for BPF 204, and the third column of 3×3 matrix 228 could include gain values that may be applied to the outputs of LPF 222, BPF 224, and HPF 226 to generate a combined gain value for HPF 206.

For example, and without limitation, a simple set of gain values for 3×3 matrix 228 could reflect an identity matrix. With this configuration, 3×3 matrix 228 would simply map each output of LPF 222, BPF 224, and HPF 226, to each gain input of LPF 222, BPF 224, and HPF 226, respectively, without any gain changes to these signals or combinations thereof. However, the specific gain values included in 3×3 matrix 228 can also be made to be more diverse to achieve a wider variety of different processing and/or filtration effects.

For example, and without limitation, the gain values within 3×3 matrix 228 could be defined to reduce low-range frequencies within speech signal 170 and high-range frequencies within speech signal 170, thereby causing 3×3 matrix 228 to generate combined gain values for crossover filter 200 that depend solely on the mid-range frequencies within speech signal 170. Or, in another example, and without limitation, the gain values within 3×3 matrix 228 could be defined to generate a combined gain value for BPF 204 that depends on a linear combination of LPF 222, BPF 224, and HPF 226, without limitation. Persons skilled in the art will understand and appreciate the breadth of possible processing options that 3×3 matrix 228 affords multiband ducker 150-2. In practice, the specific gain values included in 3×3 matrix 228 may be determined via empirical analysis. In one embodiment, 3×3 matrix 228 is a matrix multiplier element that is configured to perform matrix multiplication operations involving the various gain values described above.

Based on the combined gain values output by 3×3 matrix 228, LPF 202, BPF 204, and HPF 206 within crossover filter 200 separate music signal 180 into low range, mid range, and high range signals, respectively, and then generates different scaled output signals according to the combined gain values. In particular, LPF 202 is configured to output a low range signal scaled according to a first combined gain value generated in conjunction with the first column of 3×3 matrix 228, BPF 204 is configured to output a mid range signal scaled according to a second combined gain value generated in conjunction with the second column of 3×3 matrix 228, and HPF 206 is configured to output a high range signal scaled according to a third combined gain value generated in conjunction with the third column of 3×3 matrix 228.

Similar to multiband ducker 150-1, in multiband ducker 150-2, summation block 210 combines the low-range frequencies output by LPF 202, the mid-range frequencies output by BPF 204, and the high-range frequencies output by HPF 206, each scaled according to a different combined gain value, to reconstruct music signal 180, albeit with different ranges adjusted according to 3×3 matrix 228. Then, summation block 212 incorporates speech signal 170 into the combined signal output by summation block 210 to generate ducked signal 190, which is output by speaker 160.

Multiband ducker 150-2 represents an improved version of multiband ducker 150-1. In particular, multiband ducker 150-2 is capable of adjusting each different frequency range within music signal 180 relative to each corresponding range of speech signal 170. This capacity affords more granular control over the ducked signal 190. FIG. 2C, described in greater detail below, illustrates yet another possible implementation of multiband ducker 150.

FIG. 2C illustrates a multiband ducker 150-3 configured to adjust individual frequencies of music signal 180 based on corresponding frequencies within speech signal 170, according to various embodiments. As shown, multiband ducker 150-3 includes a fast Fourier transform (FFT) 230, alternation 232, an FFT 240, a frequency domain processor 242, a filter 244, a summation block 246, and an inverse FFT 248. In certain embodiments, the various FFT and inverse FFT blocks shown in FIG. 2C may be replaced by other spectral transforms and corresponding inverse transforms, including, for example and without limitation, discrete cosine transforms (DCTs), wavelet transforms, and so forth.

FFT 230 is configured to perform a Fourier transform operation to transform music signal 180 into the frequency domain, thereby identifying a set of individual frequencies present within music signal 180. FFT 230 may identify any number of different frequencies depending on the resolution of FFT 230, although the commonly used resolution of 256 allows FFT 230 to identify 256 different frequencies. FFT 230 outputs the set of identified frequencies within speech signal 170 to alternation 232.

Similar to FFT 230, FFT 240 is configured to perform a Fourier transform operation to transform speech signal 170 into the frequency domain, similarly identifying a set of individual frequencies present within speech signal 170. FFT 240 typically identifies 256 frequencies or another number of frequencies that corresponds to the resolution of FFT 240. The resolutions of FFT 230 and FFT 240 are generally equivalent, allowing the same number of frequencies to be identified within music signal 180 and speech signal 170, respectively, although such equivalence is not required. FFT 240 outputs these identified frequencies to frequency domain processor 242 and filter 244.

Filter 244 performs various filtration operations with the set of identified frequencies from speech signal 170 and then generates a different gain value for each different frequency. In one embodiment, filter 244 represents an N×M matrix, analogous to 3×3 matrix 228 described above in conjunction with FIG. 2B, where N is equal to the resolution of FFT 240 and M is equal to the resolution of FFT 230. Filter 244 drives alternation 232 with the different gain values, and in response, alternation 232 adjusts the magnitude of each different identified frequency of music signal 180 in proportion to a corresponding gain value. As such, alternation 232 may reduce specific frequencies within music signal 180 depending on the amplitude of corresponding frequencies within speech signal 170. Alternation 232 outputs these adjusted frequencies to summation block 246.

As previously described herein, frequency domain processor 242 also receives the set of identified frequencies associated with speech signal 170. Frequency domain processing 242 is configured to perform any manner of different frequency processing techniques. Persons skilled in the art will understand that, due to the computational requirements of FFT and inverse FFT operations, these operations should be performed conservatively. Accordingly, any frequency processing operations that need to be performed on speech signal 170 should be performed between FFT 240 and inverse FFT 248 to make efficient use of these elements. Frequency domain processor 242, upon processing frequency data associated with speech signal 170, outputs processed data to summation 246.

Summation 246 combines the output of frequency domain processing 242 with that of alternation 232 and transmits the combined output to inverse FFT 248. Inverse FFT 248 performs an inverse fast Fourier transform operation to generate ducked signal 190, which is then output by speaker 160. Similarly to multiband duckers 150-1 and 150-2, multiband ducker 150-3 generates ducked signal 190 that reflects both speech signal 170 and music signal 180. However, multiband ducker 150-3 is configured to adjust individual frequencies of music signal 180 to account for other individual frequencies of speech signal 170. This approach allows fine-grained control over the degree to which portions of music signal 180 are attenuated in response to speech signal 170.

Referring generally to FIGS. 2A-2C, multiband duckers 150-1, 150-2, and 150-3 represent different options for implementing the general functionality of multiband ducker 150. The different implementations may also admit to additional functionality beyond what is specifically shown in FIGS. 2A-2C. For example, and without limitation, multiband ducker 150 could pre-process speech signal 180 to reduce background noise and/or periodic noise, perform beam forming techniques to isolate specific sound sources, apply gating techniques to identify sounds with a specific loudness, and so forth. Some or all of the techniques described thus far may also be implemented outside of multiband ducker 150, i.e., at a different location on DSP 140.

Persons skilled in the art will understand that the techniques described above need not be limited to digital processing, and may be implemented in the context of analog circuitry as well. As a general matter, any technically feasible device or machine may implement the functionality of multiband ducker 150, including digital or analog circuits, as mentioned, as well as mechanical devices or acoustic devices. For example, a mechanical implementation of multiband ducker 150 could include an iris configured to notch certain frequencies depending on whether the iris is open or closed. The techniques described herein may also be implemented purely in software or in some combination of hardware and software.

In addition, the ducking techniques described thus far may be distributed across different systems. For example, a first public announcer (PA) system could be configured to generate music signal 180 and to duck specific frequencies of that signal based on the output of a second PA system configured to generate speech signal 170. With this configuration, the ducked version of music signal 180 and speech signal 170 would be output simultaneously by the first and second PA systems, respectively. Those signals would then be acoustically combined by virtue of being output at the same time to generate ducked signal 190. Generally, the various implementations discussed herein are only exemplary in nature and are in now way meant to limit the scope of the present invention. In that regard, any circuitry configured to perform the functionality described herein falls within the scope of the present invention.

Audio Signals Processed and Generated by a Multiband Ducker

FIGS. 3A-3D illustrate a set of graphs showing spectra of audio signals that are processed and generated by multiband ducker 150 of FIG. 1B, according to various embodiments. Each of graphs 300, 320, 340, and 360, depicted in FIGS. 3A, 3B, 3C, and 3D, respectively, represents a different signal that may be received or generated by multiband ducker 150 of FIG. 1B. Further, in each graph 300, 320, 340, and 360, a particular signal is plotted against a frequency axis 320 and an amplitude axis 330.

Figure 3A:
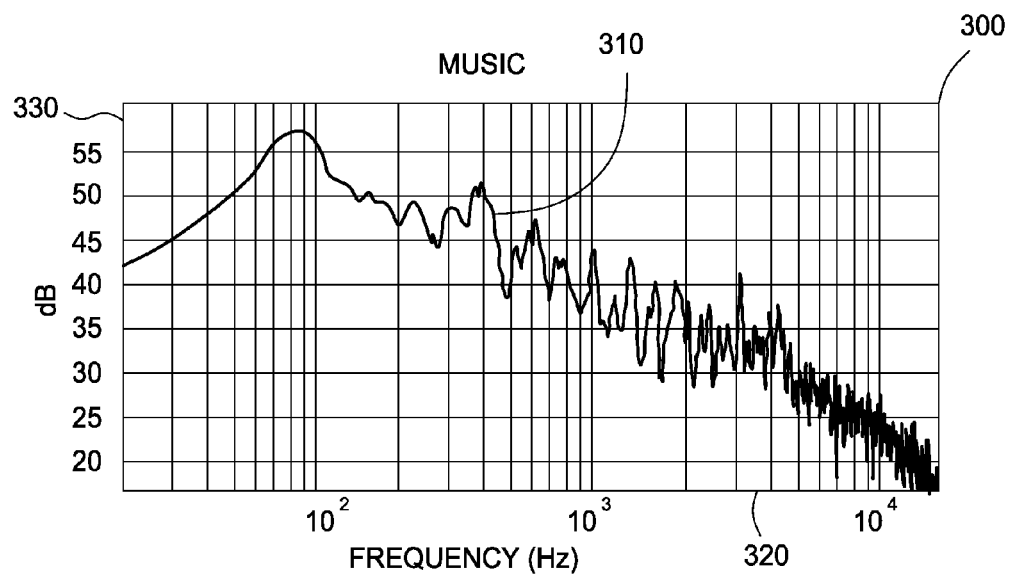
FIGS. 3A-3D illustrate a set of graphs showing spectra of audio signals that are processed and generated by the multiband ducker of FIG. 1B, according to various embodiments.

FIG. 3A sets forth a logarithmic graph 300 depicting a plot 310 that represents music signal 180 of FIG. 1B. Plot 310 shows that music signal 180 includes different ranges of frequencies, including low range frequencies below 400 Hz, mid range frequencies between 400 Hz and 4 kHz, and high range frequencies above 4 kHz. Persons skilled in the art will understand that "low," "mid," and "high" frequency ranges are defined by convention only. Any specific values discussed in conjunction with these ranges are provided for illustrative purposes only and are not meant to limit the scope of the present invention in any way.

Figure 3B:
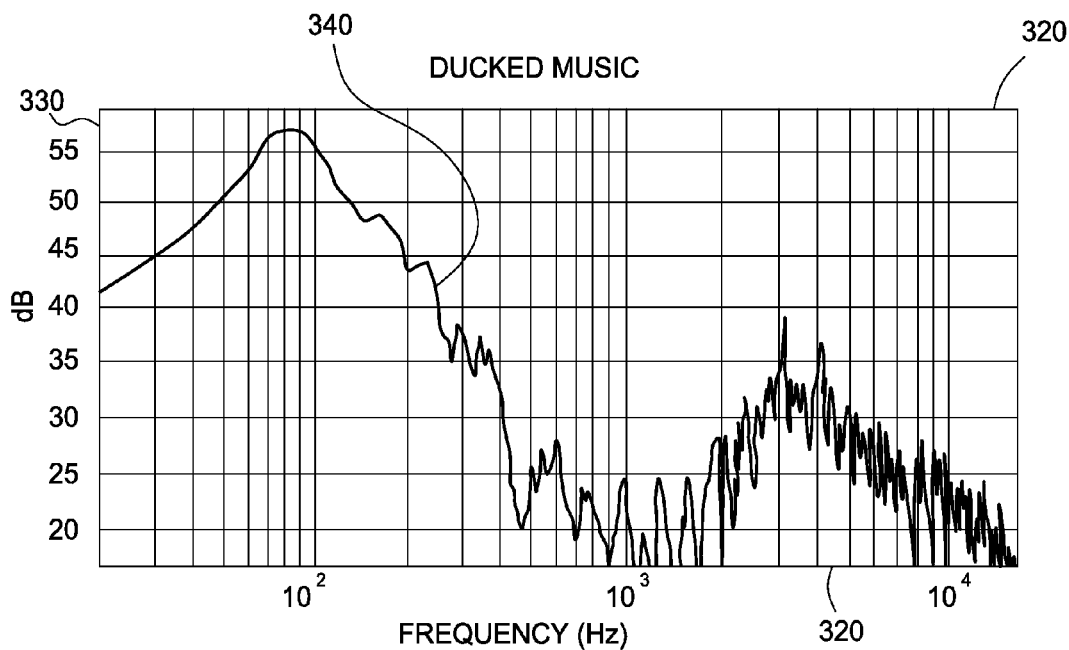

FIG. 3B sets forth a logarithmic graph 320 depicting a plot 330 that represents a ducked version of music signal 180. The ducked version of music signal 180 could be output, for example, and without limitation, by crossover filter 200 shown in FIG. 2A. Plot 330 illustrates that crossover filter 200 "notches" out the mid range frequencies present in music signal 180, leaving the low range frequencies and high range frequencies relatively intact.

Figure 3C:
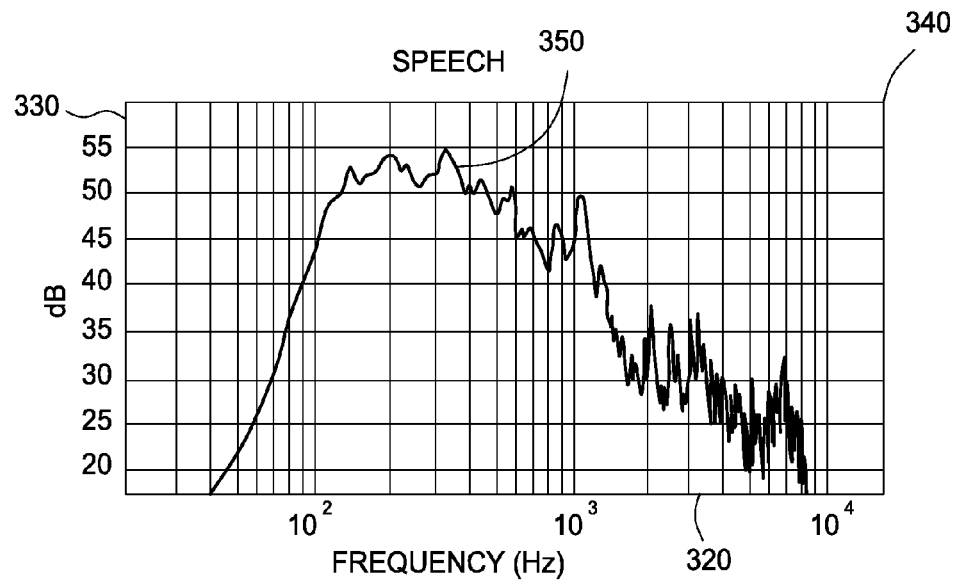

FIG. 3C sets forth a logarithmic graph 340 depicting a plot 350 that represents speech signal 170. Plot 350 illustrates that speech signal 170 primarily includes frequencies with mid range values, typically ranging from 200 Hz to 3 kHz. Speech signal 170 has relatively low amplitude in the low-range frequencies and the high-range frequencies.

Figure 3D:
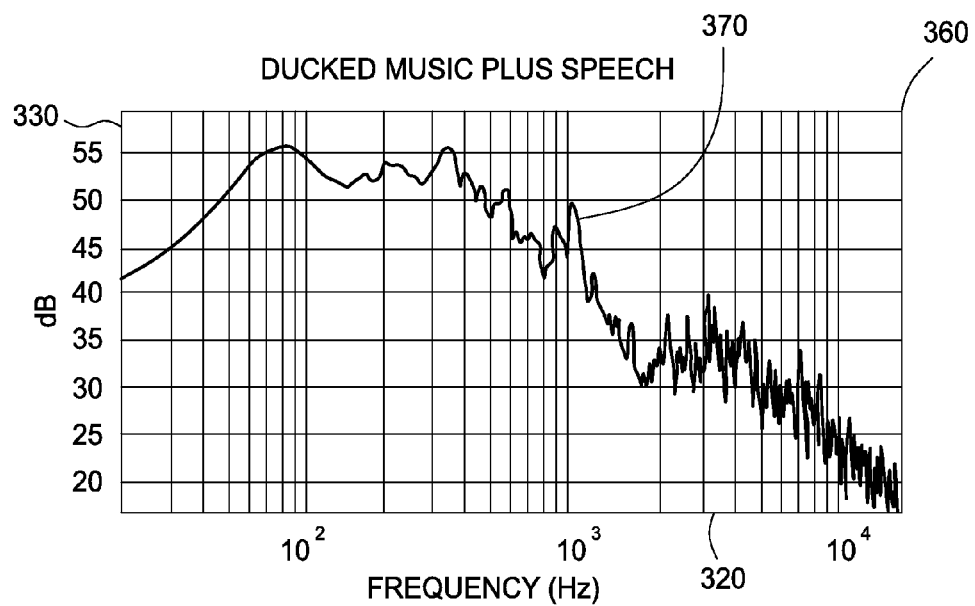

FIG. 3D sets forth a logarithmic graph 360 depicting a plot 370 that represents ducked signal 190 shown in FIGS. 1B-2C. Multiband ducker 150 generates ducked signal 190 by combining the ducked version of music signal 180 shown in FIG. 3B with speech signal 170 shown in FIG. 3C. Plot 370 illustrates that combining the ducked version of music signal 180 with speech signal 170 results in a signal with a frequency profile comparable to that associated with the original music signal. Ducked signal 190 is thus shown to lack significant interference between the two signals from which ducked signal 190 derives. Accordingly, when output to user 100, ducked signal 190 may include intelligible speech associated with mid range frequencies, as well as low range and high range frequency components of music signal 180, yet lack interference between the corresponding frequency ranges.

Technique for Multiband Ducking

Figure 4:
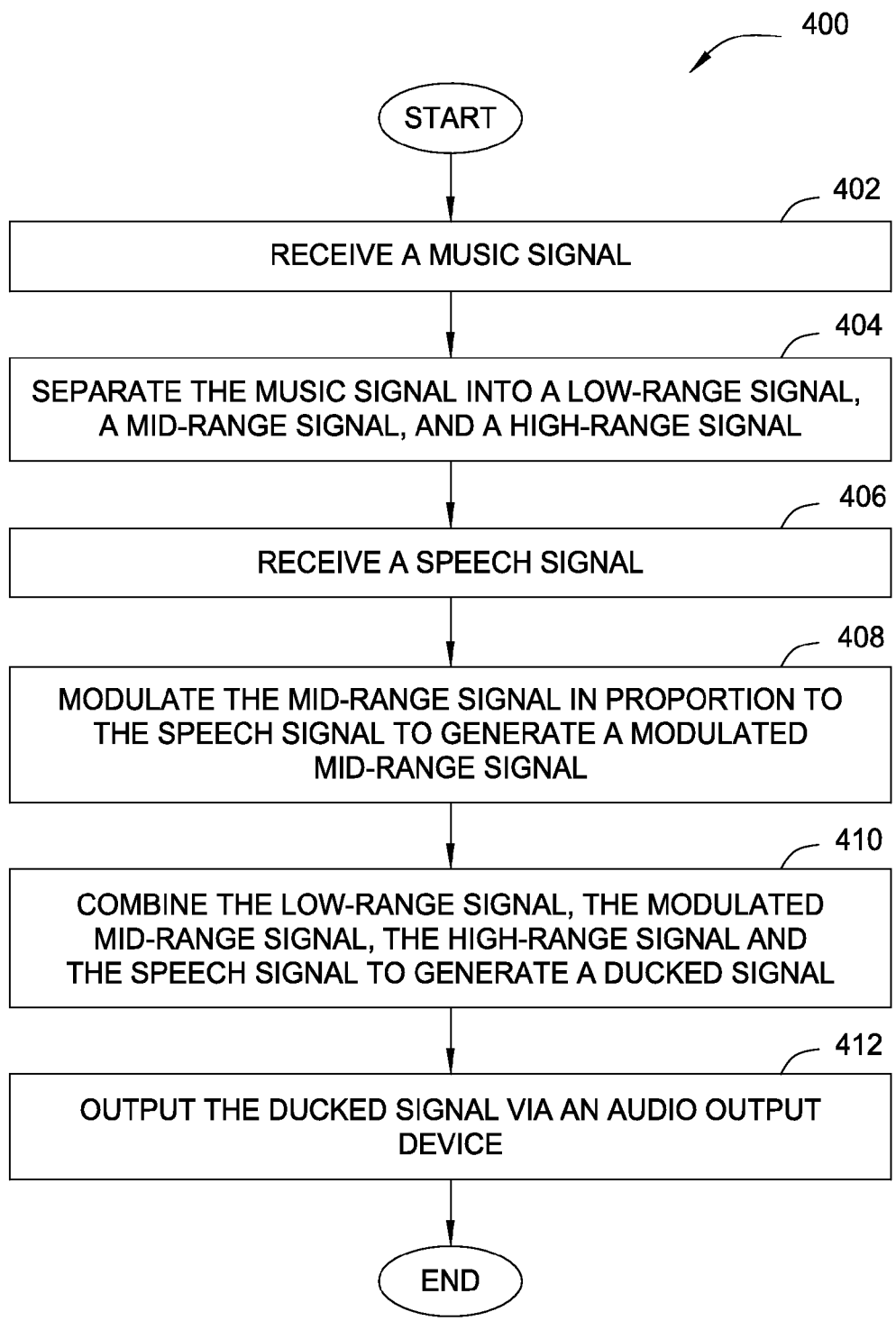
FIG. 4 is a flow diagram of method steps for combining speech and music signals, according to various embodiments.

FIG. 4 is a flow diagram of method steps for speech and music signals, according to various embodiments. Although the method steps are described in conjunction with the systems of FIGS. 1-3D, persons skilled in the art will understand that any system configured to perform the method steps, in any order, is within the scope of the present invention.

As shown, a method 400 begins at step 402, where multiband ducker 150 within headphone 110 receives a music signal. The music signal typically derives from portable music player 120, although persons skilled in the art will recognize that any source of music may provide a music signal without departing from the general scope of the techniques described herein. The music signal received at step 402 may be music signal 180 discussed above in conjunction with FIGS. 1B-3D.

At step 404, multiband ducker 150 separates the music signal into a low range signal, a mid range signal, and a high range signal. The low range signal may include frequencies below 400 Hz, the mid range signal may include frequencies between 400 Hz and 4 kHz, while the high range signal may include frequencies above 4 kHz, although these values are provided for exemplary purposes only, without limitation. A crossover filter may perform the separation of the music signal using low-pass, band-pass, and high-pass filters configured to isolate the aforementioned frequency ranges. The crossover filter could be, for example and without limitation, crossover filter 200 shown in FIGS. 2A-2B. Multiband ducker 150 could also perform a frequency-based separation associated with step 404 via frequency domain processing techniques, as discussed above in conjunction with FIG. 2C.

At step 406, multiband ducker 150 receives a speech signal. The speech signal may be transduced from the external environment via a microphone, such as, e.g., microphone 130, without limitation, or received from some other source. Upon receiving the speech signal, multiband ducker 150 may perform any manner of speech processing to filter the speech signal, including, for example, and without limitation, noise reduction, beam forming, filtration, loudness gating, and so forth. The speech signal received at step 406 may be speech signal 170 discussed above in conjunction with FIGS. 1B-3D.

At step 408, multiband ducker 150 adjusts the mid range signal separated from the music signal at step 404 in inverse proportion to the speech signal received at step 406 to generate a modulated mid range signal. In doing so, multiband ducker 150 may adjust the gain value of the specific filter used to separate the mid range signal from the other signals, in like fashion as described above in conjunction with FIGS. 2A-2B. Multiband ducker 150 may also adjust the gain value applied to a specific set of frequencies within the music signal relative to a set of identified frequencies within the speech signal, e.g., via the frequency domain processing techniques described above in conjunction with FIG. 2C, without limitation.

At step 410, multiband ducker 150 combines the low range signal, the modulated mid range signal, the high range signal, and the speech signal to generate a ducked signal. The ducked signal reflects both the original music signal and the received speech signal. However, since specific frequencies of the original music signal have been diminished relative to the speech signal, interference between those frequencies may be avoided in the ducked signal. The ducked signal may be ducked signal 190 discussed above in conjunction with FIGS. 2A-3D.

At step 412, multiband ducker 150 causes the ducked signal to be output to user 100 via an output device, such as, e.g., speaker 160, without limitation. User 100 may continue to listen to music being played based on music signal 180, and, additionally, may also perceive intelligible speech associated with speech signal 170. The method 400 then terminates.

In sum, a multiband ducker is configured to duck a specific range of frequencies within a music signal in proportion to a corresponding range of frequencies within a speech signal, and then combine the ducked music signal with the speech signal for output to a user. In doing so, the multiband ducker separates the music signal into different frequency ranges, which may include low, middle, and high range frequencies. The multiband ducker then reduces the amplitude of the specific range of frequencies found in the speech signal, typically the mid range frequencies. When the ducked music signal and the speech signal are combined, the resultant signal includes important frequencies of the original music signal, including low range and high range frequencies, thereby allowing perception of the music signal to continue in relatively uninterrupted fashion. Additionally, the combined signal also includes the speech signal, allowing for the perception of intelligible speech concordant with the perception of music.

At least one advantage of the multiband ducker set forth herein is that users may listen to music in a continuous and uninterrupted manner and still maintain a certain degree of awareness of the external auditory environment. Accordingly, users are less likely to be disturbed when other people attempt conversation, because the multiband ducker allows music to continue playing while accommodating the speech of others. The multiband ducker therefore provides a significantly enhanced user experience compared to conventional duckers, which simply silence music altogether.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as compact disc read only memory (CD-ROM) disks readable by a CD-ROM drive, flash memory, read only memory (ROM) chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

What is claimed is:

1. A method for generating an audio signal, the method comprising:
  receiving a first signal associated with a voice input;
  receiving a second signal associated with an audio input;

separating the first signal into a first low frequency signal and a first middle frequency signal;

separating the second signal into a second low frequency signal and a second middle frequency signal;

adjusting an amplitude associated with the second middle frequency signal by:

generating a combined gain value based on applying a first gain value to an amplitude associated with the first low frequency signal and applying a second gain value to an amplitude associated with the first middle frequency signal, and applying the combined gain value to the second middle frequency signal to generate an adjusted middle frequency signal;

combining the first signal with the adjusted middle frequency signal and the second low frequency signal to generate a combined signal; and causing an output device to output the combined signal.

2. The method of claim 1, wherein receiving the first signal comprises causing a microphone to transduce audio associated with an external environment.

3. The method of claim 2, wherein the first signal comprises a priority signal that originates from the external environment.

4. The method of claim 1, wherein receiving the second signal comprises causing an audio device to generate the second signal.

5. The method of claim 4, wherein the combined signal comprises the adjusted middle frequency signal and includes the second low frequency signal that is not adjusted.

6. The method of claim 1, wherein combining the first signal with the adjusted middle frequency signal and the second low frequency signal to generate the combined signal comprises combining a portion of the first middle frequency signal that is associated with a first frequency range with a portion of the adjusted middle frequency signal that is associated with a second frequency range.

7. The method of claim 6, wherein the first frequency range is substantially the same as the second frequency range.

8. The method of claim 1, wherein the first signal is further associated with a first frequency range, and the second signal is further associated with a second frequency range.

9. The method of claim 8, wherein a portion of the second signal that is associated with the second frequency range is not adjusted.

10. The method of claim 9, wherein combining the first signal with the adjusted middle frequency signal and the second low frequency signal further comprises combining a portion of the first signal associated with the first frequency range with the portion of the second signal associated with the second frequency range.

11. A system for generating an audio signal, comprising:
an audio input device configured to receive a first signal associated with a voice input;
a circuit coupled to the audio input device and configured to:
receive a second signal associated with an audio input,
separate the first signal into a first low frequency signal and a first middle frequency signal;
separate the second signal into a second low frequency signal and a second middle frequency signal;
adjust an amplitude associated with the second middle frequency signal by:
generating a combined gain value based on applying a first gain value to an amplitude associated with the first low frequency signal and applying a second gain value to an amplitude associated with the first middle frequency signal, and
applying the combined gain value to the second middle frequency signal to generate an adjusted middle frequency signal, and
combine the first signal with the adjusted middle frequency signal and the second low frequency signal to generate a combined signal; and
an audio output device configured to output the combined signal.

12. The method of claim 1,
wherein separating the first signal further comprises separating the first signal into a first high frequency signal, and
wherein adjusting the amplitude associated with the second middle frequency signal further comprises adjusting the amplitude associated with the second middle frequency signal based on the amplitude associated with the first low frequency signal, the amplitude associated with the first middle frequency signal, and an amplitude associated with the first high frequency signal to generate the adjusted middle frequency signal.

13. The system of claim 11, wherein the circuit comprises a digital circuit or an analog circuit.

14. The system of claim 11, wherein the circuit includes:
a filter circuit, having:
a first filter configured to:
isolate a first portion of the second signal that is associated with a middle frequency range, and
adjust the first portion of the second signal, based on the combined gain value, to generate the adjusted middle frequency signal,
wherein the combined gain value is derived from the amplitude associated with the first low frequency signal and the amplitude associated with the first middle frequency signal; and
a second filter configured to isolate a second portion of the second signal that is associated with a low frequency range.

15. The system of claim 14, wherein the circuit further includes:
a first summer configured to combine the adjusted middle frequency signal with the second portion of the second signal to generate an adjusted second signal; and
a second summer configured to combine the first signal with the adjusted second signal.

16. The system of claim 11, wherein the circuit further comprises:
a first filter circuit, having:
a first filter configured to isolate a first portion of the first signal that is associated with a middle frequency range, and
a second filter configured to isolate a second portion of the first signal that is associated with a low frequency range; and
a second filter circuit, having:
a third filter configured to:
isolate a first portion of the second signal that is associated with the middle frequency range, and
adjust the first portion of the second signal, based on the combined gain value, to generate a first adjusted portion of the second signal, and
a fourth filter configured to:
isolate a second portion of the second signal that is associated with the low frequency range, and adjust the second portion of the second signal, based on a third gain value, to generate a second adjusted portion of the second signal.

17. The system of claim 16, wherein the circuit generates the combined gain value based on an amplitude of the first portion of the first signal and an amplitude of the second portion of first signal.

18. The system of claim 16, wherein the circuit generates the third gain value based on an amplitude of the first portion of the first signal and an amplitude of the second portion of first signal.

19. The system of claim 16, wherein the circuit further comprises:
a first summer configured to combine the first adjusted portion of the second signal with the second adjusted portion of the second signal to generate an adjusted second signal; and
a second summer configured to combine the first signal with the adjusted second signal to generate the combined signal.

20. The system of claim 11, further comprising:
a first transform circuit configured to transform the first signal from the time domain to the frequency domain to identify a first plurality of frequencies present within the first signal;
a second transform circuit configured to transform the second signal from the time domain to the frequency domain to identify a second plurality of frequencies present within the second signal; and
a first alternation circuit configured to adjust a magnitude of a middle frequency in the second plurality of frequencies based on a magnitude of a first middle frequency and a magnitude of a first low frequency in the first plurality of frequencies to generate an adjusted second plurality of frequencies.

21. The system of claim 20, further comprising a summer configured to combine the first plurality of frequencies with the adjusted second plurality of frequencies to generate a combined plurality of frequencies.

22. The system of claim 21, further comprising an inverse transform circuit configured to transform the combined plurality of frequencies from the frequency domain back into the time domain to generate the combined signal.

23. A non-transitory computer-readable medium storing program instructions that, when executed by a processing unit, cause the processing unit to generate an audio signal, by performing the steps of:
receiving a first signal associated with a voice input;
receiving a second signal associated with an audio input;
separating the first signal into a first low frequency signal and a first middle frequency signal;
separating the second signal into a second low frequency signal and a second middle frequency signal;
adjusting an amplitude associated with the second middle frequency signal by:
generating a combined gain value based on applying a first gain value to an amplitude associated with the first low frequency signal and applying a second gain value to an amplitude associated with the first middle frequency signal, and
applying the combined gain value to the second middle frequency signal to generate an adjusted middle frequency signal;
combining the first signal with the adjusted middle frequency signal and the second low frequency signal to generate a combined signal; and
causing an output device to output the combined signal.

* * * * *